United States Patent [19]

Hetherington et al.

[11] 4,302,625
[45] Nov. 24, 1981

[54] MULTI-LAYER CERAMIC SUBSTRATE

[75] Inventors: Richard J. Hetherington, Pine Plains; George E. Melvin, Poughkeepsie; Stephen A. Milkovich, Beacon; Ernest N. Urfer, Hopewell Junction, all of N.Y.

[73] Assignee: International Business Machines Corp., Armonk, N.Y.

[21] Appl. No.: 164,645

[22] Filed: Jun. 30, 1980

[51] Int. Cl.³ .............................................. H05K 1/14
[52] U.S. Cl. .................................. 174/68.5; 361/406; 361/411
[58] Field of Search ......................... 174/68.5; 29/851; 427/96, 126.2; 361/406, 409, 410, 411

[56] References Cited

U.S. PATENT DOCUMENTS

| | | | |
|---|---|---|---|
| 3,726,002 | 4/1973 | Greenstein | 174/68.5 X |
| 3,999,004 | 12/1976 | Chirino | 174/68.5 |
| 4,047,290 | 9/1977 | Weitze | 174/68.5 X |
| 4,109,377 | 8/1978 | Blazick | 427/96 X |
| 4,189,524 | 2/1980 | Lazzari | 174/68.5 X |
| 4,202,007 | 5/1980 | Dougherty | 174/68.5 X |
| 4,245,273 | 1/1981 | Feinberg | 361/382 |

*Primary Examiner*—Richard R. Kucia
*Attorney, Agent, or Firm*—Wolmar J. Stoffel

[57] ABSTRACT

An improved multi-layer ceramic substrate for mounting semiconductor devices having a low incidence of cracks between metal filled surface vias, the substrate constructed with a top ceramic layer having a thickness that is at least 20 percent greater than the underlying sheets that embody a redistribution system.

4 Claims, 3 Drawing Figures

MULTI-LAYER CERAMIC SUBSTRATE

DESCRIPTION

TECHNICAL FIELD

This invention relates to multi-layer printed circuit semiconductor packages more particularly to fired multi-layered ceramic substrates adapted to interconnect a plurality of large scale integrated circuit chips mounted on the substrate.

An object of the present invention is to provide an improved semiconductor package having a laminated multi-layer ceramic substrate provided with internal wiring that is less susceptible to cracking, that is stronger, and more reliable.

Another object of this invention is to provide an improved multi-layer ceramic substrate in which cracks between closely spaced, metal filled vias are minimized or eliminated.

Yet another object of this invention is to provide an improved multi-layer ceramic substrate which can be fabricated without significantly departing from known fabrication techniques.

Another object of this invention is to provide an improved sintered monolithic multi-layer printed circuit substrate that is free or substantially free of cracks between closely spaced, metal filled vias.

BACKGROUND ART

Ceramic materials find wide and diverse use in the fabrication of various types of elements and articles. Ceramic materials have found use in the fabrication of electrical components such as capacitors, and semiconductor device packages for supporting semiconductor devices. Such packages are comprised of a ceramic substrate with printed conductive metallurgy stripes connected to the device and to I/O pins or other connections which are joined to boards or the like. While many techniques are known for forming ceramic substrates for use in fabricating electrical components, one of the most popular procedures for such fabrication involves the casing of what is termed a "ceramic green sheet" and the subsequent processing and firing of the ceramic green sheet. Laminated multi-layer ceramic substrates provided with internal wiring are well known as illustrated and described in U.S. Pat. No. 3,564,114. Multi-layer ceramic substrates capable of mounting and interconnecting a plurality of semiconductor devices are well known and are described by an article entitled "A Fabrication Technique for Multi-Layer Ceramic Modules" by H. D. Kaiser et al in *Solid State Technology*, May 1972 P. 35–40. A sophisticated embodiment of a semiconductor package which embodies a multi-layer ceramic substrate is claimed and described in commonly assigned application Ser. No. 053,477, filed June 29, 1979 now U.S. Pat. No. 4,245,273. In this technology, green sheets of ceramic, i.e., ceramic powder held togther in sheet form by a temporary organic binder, are punched to form via holes, the via holes subsequently filled with a conductive paste, and metallurgy lines also formed on the surface, usually by screen printing. The conductive paste is formed of a refractory metal which will withstand the subsequent sintering process. The metallized sheets are stacked, laminated, and fired to form a monolithic multi-layer substrate with a complex internal electrical circuitry. This substrate structure is particularly advantageous since it affords an opportunity to do three-dimensional wiring in the substrate in what was normally waste or inaccessible space. The use of this waste space results in the creation of a high density sturdy electronic package with good performance and reliability. The fabrication of a multi-layer cercmic substrate, though simple in principal, is highly complex since the high temperature sintering process may cause reactions to occur between the components of the metallurgy and ceramic, and generate internal stresses which can cause de-lamination and cracking. As the substrate is cooled down from the sintering temperature, internal stresses are generated which can cause cracking and warpage if they are severe. This is due to different coefficients of expansion of the ceramic and conductive metal.

A desirable technique for mounting semiconductor devices on a multi-layer ceramic substrate is solder bonding the device to the substrate. In this technique, many solder pads on the surface of the device, are joined to a similar pattern of pads on the substrate. This requires a large number of closely-spaced via holes filled with conductive metal in the top layer of the substrate. A problem experienced in fabricating such a substrate is the formation of via-to-via cracks. These cracks are basically the result of thermal expansion mis-match between the conductive metal in the vias, and the ceramic material. Avoiding this thermal expansion mis-match is difficult because of the limited selection of conductive metals which will withstand the sintering temperature and also ceramic materials that will satisfy the demands of packaging.

DISCLOSURE OF INVENTION

In accordance with the present invention, we provide an improved multi-layer ceramic substrate for a semiconductor package in which cracking between vias is substantially eliminated. The improved multi-layer ceramic substrate, formed of a plurality of ceramic green sheets which are sintered, has a plurality of sheets with re-distribution metallurgy patterns located in the upper portion of the substrate with the thickness of the sheets in the unfired state in the range of 6–9 mils, and an overlying top ceramic sheet having a thickness of at least 20% greater than the individual thicknesses of the underlying sheets with the re-distribution metallurgy pattern, the top sheet having a via pattern filled with a conductive metal wherein the vias have a center-to-center spacing when fired in the range of 7–12 mils with the via diameter being in the range of 35–55% of the center-to-center via spacing.

BRIEF DESCRIPTION OF THE DRAWINGS

In the accompanying drawings, forming a material part of this disclosure

DISCLOSURE OF INVENTION

For further comprehension of the invention and the obvious advantages thereto, reference will be had to the following description and accompanying drawings and to the appendant claims in which the various novel features of the invention are more particularly set forth.

Figure 1:
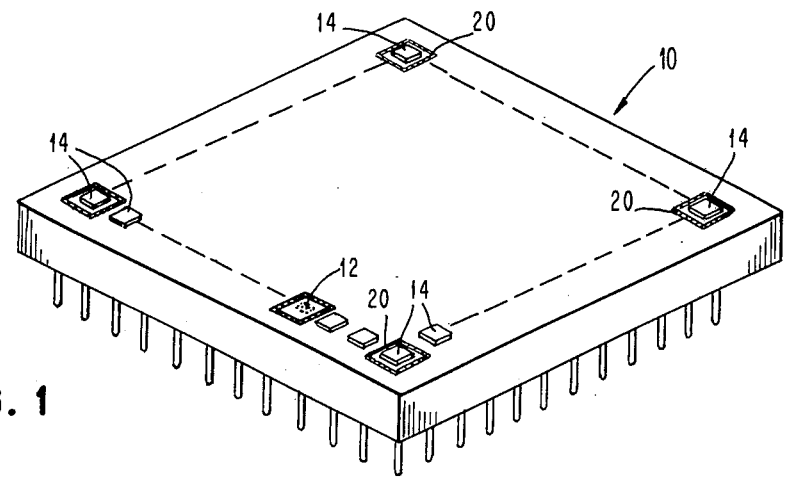
FIG. 1 is a perspective view of a multi-layer ceramic substrate for a semiconductor package in which is embodied the invention for eliminating or minimizing via to via cracking.
Figure 2:
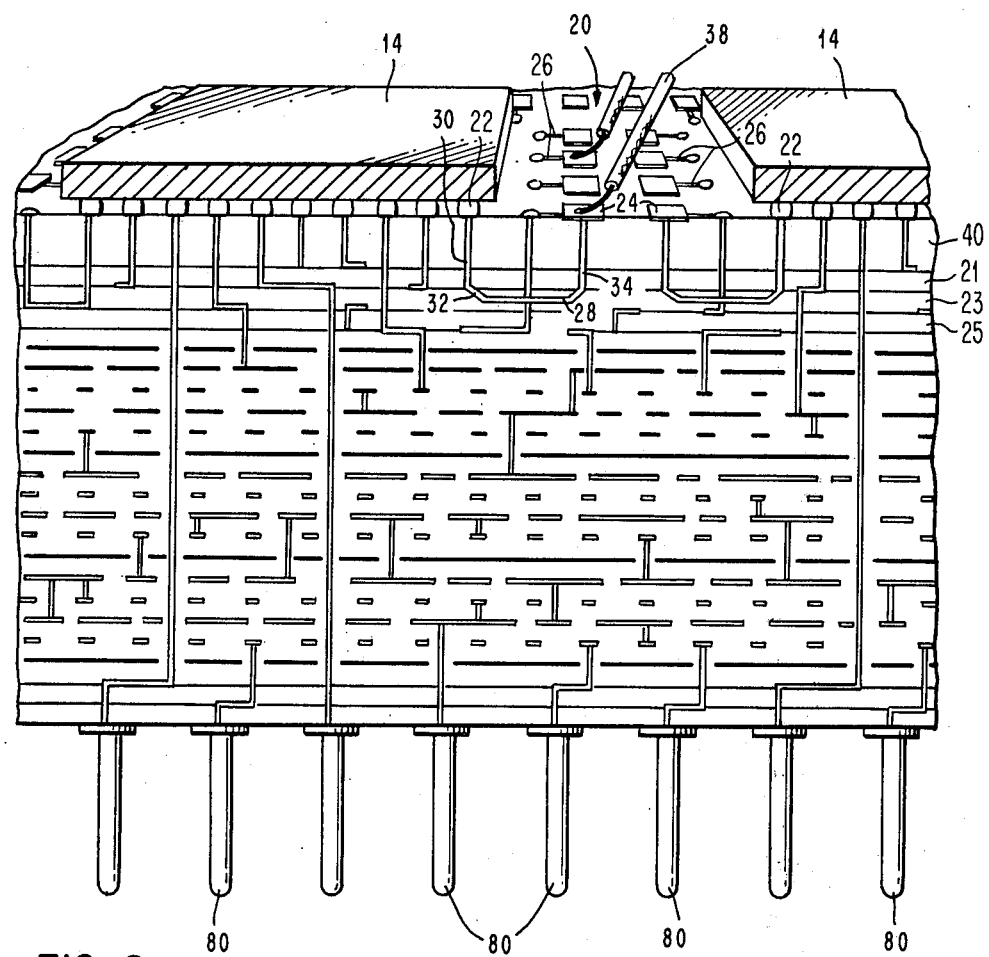
FIG. 2 is a perspective view in broken section with the dimensions in the vertical scale enlarged of a substrate illustrated in FIG. 1 showing a typical internal conductive network including wiring planes, fan out wiring planes, etc., and engineering change pads on the surface, which illustrates an embodiment of a substrate structure of the invention.
Figure 3:
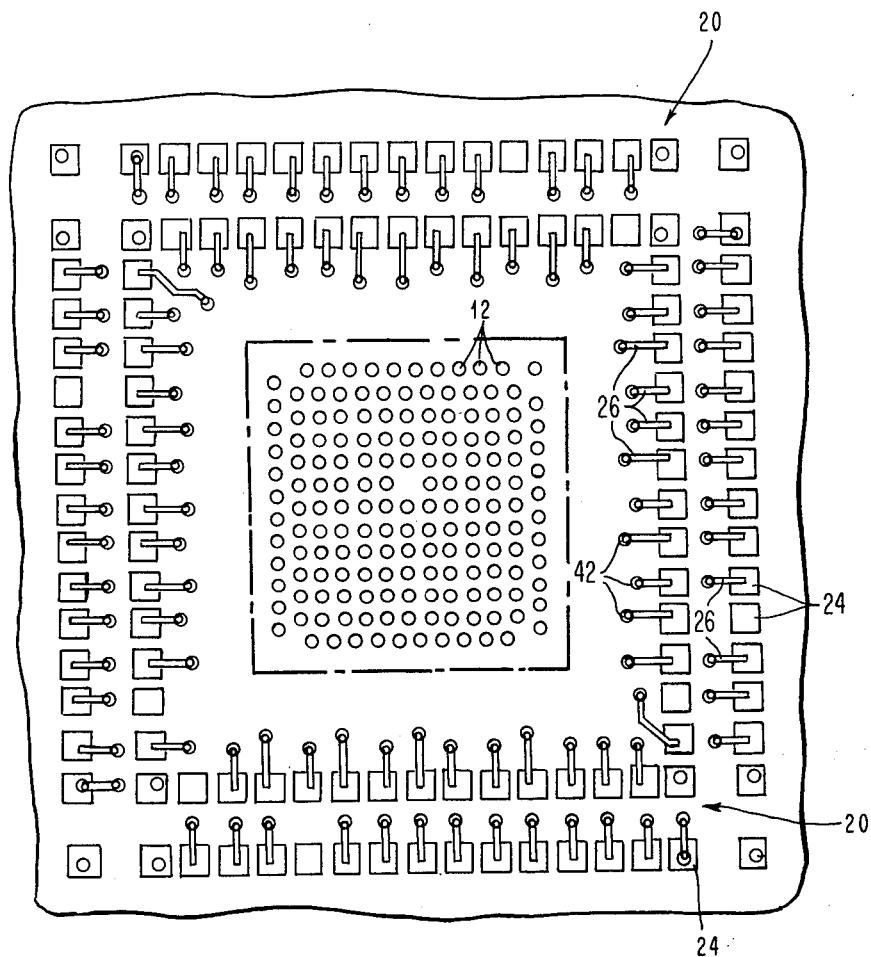
FIG. 3 is a top plan view illustrating a typical solder pad pattern to which a semiconductor device can be joined by solder bonding techniques, and the surrounding engineering change pads to which our invention has special application.

Referring now to FIG. 1 of the drawings, there is illustrated a typical laminated multi-layer ceramic substrate in which the concept of our invention can be applied. The substrate 10 can be of any suitable size to accommodate the desired number of devices. The devices on the substrate can be of the order of 100 or more. In FIG. 1, all of the device sites for joining devices to the surface are not shown in the interest of reducing drawing complexity. Typically, device sites would be arranged in columns and rows with typically 10 columns arranged in 10 rows, making a total of 100 devices. Representative sites are shown in FIG. 1. Substrate 10 has an internal circuitry, as described in the background section of this specification, i.e., made up of a plurality of laminated and sintered layers with via holes and printed circuits. A cross-section of the internal circuitry is depicted in FIG. 2. The material of the substrate 10 is chosen for good mechanical, electrical and thermal properties so that the thermal expansion is a reasonably close match to the silicon material of the devices to be mounted on the substrate. The top surface of substrate 10 is provided with a plurality of pads 12, more clearly shown in FIG. 3, adapted to be joined to a corresponding pattern of solder pads on a semiconductor device 14. An asymmetrical pattern permits joining the device 14 in only one correct position, as illustrated in FIG. 3. Surrounding each of the cluster of pads 12 are one or more rows of engineering change pads 24. As more clearly illustrated in FIG. 2, the rows of engineering change pads 24 provide easy access to terminals 22 of device 14. Each of the signal input-output terminals of device 14 may be provided with an engineering change pad. A typical engineering change pad has a pad portion 24 and a severable link portion 26. As shown in FIG. 2 the pad portion 24 is joined to the device terminal 22 with a conductive metallurgy pattern 28. Pattern 28 consists of a vertically extending via 30 which extends through one or more via holes in one or more ceramic layers, a stripe portion 32 imprinted on the surface of the green sheet, and another vertical via 34 also consisting of filled via holes in one or more sheets of ceramic. As is evident in FIG. 2, layers 21, 23 and 25 are redistribution layers in the substrate which perform the function of spreading out the very closely spaced pad terminals 22 of the device 14. In the ceramic layers below layer 25 the geometry of the vias and lines is larger and corresponds more to the spacing of the I/O pins 80 on the bottom surface of substrate 10. Internal defects such as opens or shorts in conductive lines within the substrate 10 can be corrected by connecting a wire 38 to an engineering change pad 24, as shown in FIG. 2, which thus establishes electrical contact to the associated terminal 22 of device 14. The associated deletable link 26 can be broken and the other end of wire 38 joined to another device terminal in similar fashion. Thus two separate device terminals on different devices can be electrically connected in the event that the internal circuitry in the substrate is defective. Referring now to FIG. 3 of the drawing, the spacing of the pads in pad configuration 12 is governed by the pad configuration on the device 14 to be joined. Each of the pads is located over a via hole filled with conductive material which passes through the top or uppermost sheet 40 of substrate 10. Conductive lines joined to vias in layers 21, 23 and 25, establish electrical connections between the pads 12 and pads 24 on sheet 40. Thus the top sheet 40 of substrate 10 has a via hole pattern consisting of very closely spaced vias, particularly under pads 12. In addition, associated with deletable links 26 there are vias filled with conductive material also contained in sheet 40. In the fabrication of multi-layer ceramic substrates, as described in IBM Technical Disclosure Bulletin Vol. 20 No. 1 June 1977 P. 141 cracks between closely spaced vias have been noted. These cracks represent a troublesome yield problem. These cracks develop during the sintering process. Conductive metals can become deposited in the cracks from plating solutions and the like used to complete the top surface metallurgy of the substrate. This can cause shorting between the pads. Still further, cracks can develop between a whole row of vias and propagate downwardly into the substrate 10. This weakens the substrate and potentially could sever the conductive lines within the substrate 10, and weaken the structure of the substrate.

Cracking between closely spaced vias is believed to be caused by the differential coefficient of expansion of the conductive material in the vias and the ceramic material of the sheet. Stresses are induced during sintering as the temperature of the substrate is lowered below a point when the glass in the ceramic solidifies to form a rigid structure surrounding the refractory metal in the vias. As the temperature is lowered further, the ceramic material which possesses a higher coefficient of expansion contracts tightly around the conductive metal plugs in the vias and stresses are developed. When the stresses exceed the strength of the material, a crack is formed. The strength of the top layer could be increased by spacing the vias further apart. However, this is not feasible since the center-to-center spacing of the vias beneath the pads under the device is governed by the device pad configuration. As the devices become even more highly integrated, the space on the devices for each circuit will become smaller and the pads consequently become more dense. Presently the center-to-center spacing is on the order of 7 to 12 mils. The via diameter is governed largely by the size of the punch necessary to form the vias. The via holes must be sufficiently small to accommodate the via patterns of the device pad configuration. However, if the vias are made very small, it will necessitate very small punch elements which are weak and wear out rapidly. Also, via holes that are smaller are more difficult to fill with conductive paste. The thickness of the green sheet (unfired) used to fabricate substrate 10 are in the range of 6 to 9 mils. The sheets must be sufficiently thick so that they will withstand the necessary handling during processing and provide suitable electrical characteristics. However, if the sheets are too thick the overall thickness of the substrate will increase which will also increase the internal line length which is objectionable. Also, very thick sheets are objectionable because it causes excessive wear on the punch elements used to form the vias and also presents problems in removing the punched material completely from the resultant formed holes. Via filling of very thick sheets with conductive paste is also more difficult.

We have discovered that via-to-via cracking can be minimized or eliminated by fabricating a multilayer ceramic substrate with the upper or outer sheet with a thickness greater than the thicknesses of the underlying green sheets. This is unexpected since in theory the incidence of via-to-via cracking should be independent of the thickness of the green sheet. Preferably in the practice of our invention, the thickness of the outer sheet should exceed the thickness of the underlying sheets by at least 20%. The relative sheet thicknesses is applicable in general to the several sheets directly below the upper sheet which are generally part of the fan-out metallurgy. Via-to-via cracking is not considered a problem except in the outer sheet. The vias are normally closely spaced in the upper or outer sheet, and/or possibly the underside of the substrate. The vias in the sheets in the center of the substrate are more widely spaced and, therefore, internal stresses sufficient to cause cracking are not generated. Further, the internal laminated sheets derive strength from the adjacent sheets positioned on each side which is usually sufficient to withstand any internal stresses. In contrast, the upper or outermost sheet is not as resistant to cracking since it is supported on only one side.

The invention is applicable, therefore, when the outermost sheet contains a plurality of closely spaced vias, as in a pad cluster for solder bonding devices, and/or where there is one or more rows of closely spaced vias. The spacing where cracking may occur in conventional substrates is dependent on the ceramic materials, the conductive material in the vias, and the size of the vias. In general the most important factor is the difference between the difference in the coefficients of expansion of the ceramic and conductive metal. When there is a need for the structure and method of the invention a differential coefficient of expansion of $0.8 \times 10^{-6}/°C.$, of ceramic and metal with a center to center via spacing of 7-10 mils, and with the via diameter in the range of 35-55% of the center to center spacing is present in a multilayer ceramic module.

The following example is included to teach one skilled in the art a preferred method of practicing the invention and to illustrate the advantages derived therefrom. The example is not intended to unduly limit the scope of protection of applicants' invention.

EXAMPLE I

A green ceramic tape doctor bladed to a dried thickness of 8 mils (0.20 mm) from a slurry consisting of a solid phase of 89% $Al_2O_3$, by weight and 11% glass by weight, composed of 30% $Al_2O_3$, 50% $SiO_2$, 9% CaO, 9% MgO and 2% miscellaneous metal oxide, combined with a liquid vehicle of polyvinylbutyral resin, a plasticizer, and a solvent for the resin. The resultant green tape was cut into small sheets, via holes punched into the sheets, and a conductive metal paste screened into the via holes and onto the surface to form patterns. The sheets were assembled to form multi-layered ceramic substrates. A conductive paste consisted of a mixture of 85% molybdenum particles, by weight, with 4% of the above-described being composed of the solid phase in the ceramic, and 15% 2,2,4 trimethylpentanideol, 1,3, monoisobutyral, sold under the trademark "Texanol" by Eastman Kodak. Multi-layer ceramic substrates were formed by assembling 22 of the aforedescribed sheets, but which lacked only top sheets. A green ceramic sheet was doctor bladed to a dried thickness of 11 mils (0.28 mm) for the top layer of a first set of substrates that embody the method and structure of the invention. Conventional 8 mil sheets were placed on a second set of substrates to serve as a standard for comparison and represent the standard practice in the art. Identical specific via patterns were punched in both sets of top sheets in the 8 and 11 mil sheets. The patterns in each sheet included 9 grids of an 11 by 11 matrix of via holes where the center to center spacing was 9.8 mils (0.25 mm). In addition, 36 individual rows of 26 vias with a center to center spacing of 9.8 mils (0.25 mm) were also punched. These rows were spaced from each other by a distance significantly greater than the center to center spacing. The diameter of all of the vias was 5.5 mils (0.14 mm). The top sheets were assembled with the substrates consisting of the 22 previously described sheets and the resultant substrate laminated at 3200 psi at 75° C. and thereafter subjected to a sintering cycle. The substrates were sintered for 34 hours during which a peak temperature of 1560° C. is achieved. During the sintering the substrates shrank approximately 17%. A comparison of the material properties of the sintered ceramic in conductive paste in the via holes is as follows:

|  | Modulus of the Elasticity | Coefficient of Expansion (25° C.) |
|---|---|---|
| Via Metal | $45 \times 10^6$psi | $6.3 \times 10^{-6}/°C.$ |
| Ceramic | $49 \times 10^6$psi | $7.8 \times 10^{-6}/°C.$ |

The coefficient of expansion indicates that internal stresses will be genrated in the punched ceramic sheets which, under normal conditions, will result in cracks between vias. In all, 12 substrates with an 11 mil top layer and 6 substrates with an 8 mil top layer (before sintering) were processed and inspected. The substrates were exposed to an accelerated aging environment, i.e., exposure to a plating bath. The plating bath was a conventional gold immersion bath at room temperature. This bath was discovered to cause a breakdown in the ceramic which permitted, after a period of time, the internal stresses to form cracks between the vias. The acceleration factor was one hour in the bath was equal to 3,000 hours of operation at 30° C./80% RH. Periodic inspections revealed the following via to via cracks: Substrate % of via to via cracks

| | TIME (Hours) | | | | | |
|---|---|---|---|---|---|---|
| 11 mil | $T_o$ | 10 | 20 | 40 | 65 | 100 |
| chip site | 0% | 0% | 0 | .002% | .002% | .005% |
| EC rows | (rows not inspected) | | | .1% | .3% | .4% |
| 8 mil | | | | | | |
| chip site | 0% | 0% | 0 | .006% | .008% | .019% |
| EC rows | (rows not inspected) | | | .3% | .5% | .9% |

As the above data indicates, the substrates with the thicker top layer were significantly more resistant to via to via cracking.

We claim:

1. An improved multi-layer ceramic substrate for maintaining a plurality of semiconductor devices in a semiconductor package comprising
a monolithic sintered ceramic substrate formed of a plurality of ceramic green sheets,
said substrate having a plurality of sheets having redistribution metallurgy patterns including vias located on the top portion of the substrate, said layers each having a thickness in the range of 4.5–6.5 mils, an overlying top sheet having a thickness of at least 20% greater than the individual thicknesses of the said underlying sheets having redistribution metallurgy patterns, said top sheet having a via pattern filled with a conductive metal wherein said vias have a center to center spacing in the range of 7 to 12 mils, with the via diameter being in the range of 35 to 55% of the center to center via spacing, said sintered ceramic substrate and said conductive metal in said vias having a difference of coefficient of expansion of at least $0.8 \times 10^{-6}/°C$.

2. The multilayer ceramic substrate of claim 1 wherein said via pattern in said top sheet has at least one grid pattern adapted to provide a solder pad configuration for joining a semiconductor device by solder bonding techniques.

3. The multilayer ceramic substrate of claim 2 where said via grid pattern is surrounded by at least 1 row of vias spaced outwardly from said grid pattern and serving as engineering change pads.

4. The multilayer ceramic substrate of claim 1 wherein the diameters of the vias in said top sheet are approximately the same as the diameters of said vias associated with said redistribution metallurgy patterns.

* * * * *